US007804160B2

(12) United States Patent
Nanba et al.

(10) Patent No.: US 7,804,160 B2
(45) Date of Patent: Sep. 28, 2010

(54) ULTRASONIC BONDING EQUIPMENT FOR MANUFACTURING SEMICONDUCTOR DEVICE, SEMICONDUCTOR DEVICE AND ITS MANUFACTURING METHOD

(75) Inventors: Masataka Nanba, Hyogo-ken (JP); Shigeru Tanabe, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 716 days.

(21) Appl. No.: 11/268,555

(22) Filed: Nov. 8, 2005

(65) Prior Publication Data
US 2006/0118932 A1 Jun. 8, 2006

(30) Foreign Application Priority Data
Nov. 9, 2004 (JP) ............... 2004-324640
Oct. 25, 2005 (JP) ............... 2005-310170

(51) Int. Cl.
*H01L 23/495* (2006.01)
(52) U.S. Cl. ............... 257/666; 257/676; 257/E21.518; 257/E23.034; 257/E23.044; 418/123
(58) Field of Classification Search ........... 257/666, 257/676, E21.518, E23.034, E23.044; 438/123
See application file for complete search history.

(56) References Cited
U.S. PATENT DOCUMENTS 5,205,032 A * 4/1993 Kuroda et al. ........... 29/740
6,478,212 B1 * 11/2002 Engel et al. ............ 228/5.7
6,494,976 B1 12/2002 Hayashi et al.
6,707,138 B2 * 3/2004 Crowley et al. ......... 257/676
6,903,450 B2 6/2005 Funato et al.

FOREIGN PATENT DOCUMENTS
JP 9-108853 4/1997
JP 2004-221294 8/2004

OTHER PUBLICATIONS
U.S. Appl. No. 11/179,596, filed Jul. 13, 2005, Shigeru Tanabe, et al.

* cited by examiner

*Primary Examiner*—Lynne A Gurley
*Assistant Examiner*—Meiya Li
(74) *Attorney, Agent, or Firm*—Oblon, Spivak, McClelland, Maier & Neustadt, L.L.P.

(57) ABSTRACT

An ultrasonic bonding equipment for manufacturing a semiconductor device comprises a tip portion. The tip portion has a top surface which is faced to a member to be bonded, and propagates an ultrasonic vibration to the top surface. A plurality of protruding portions are provided on the top surface. Each of the protruding portions has: a first pair of opposite side surfaces inclined with respect to the top surface; and a second pair of opposite side surfaces substantially vertical to the top surface. A semiconductor device comprises: a semiconductor chip; a lead; and a bonding strap electrically connecting the semiconductor chip and the lead. A recess is formed on an upper surface of the bonding strap in at least one of a first region where the bonding strap and the semiconductor chip are connected and a second region where the bonding strap and the lead is connected. A first pair of opposite side surfaces of the recess are inclined with respect to the upper surface of the bonding strap, and a second pair of opposite side surfaces of the recess are substantially vertical to the upper surface of the bonding strap.

10 Claims, 16 Drawing Sheets

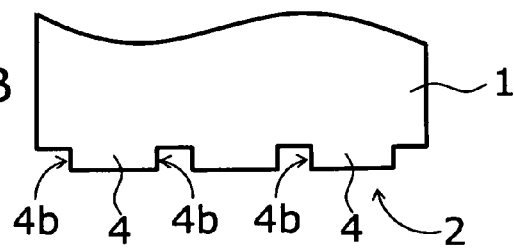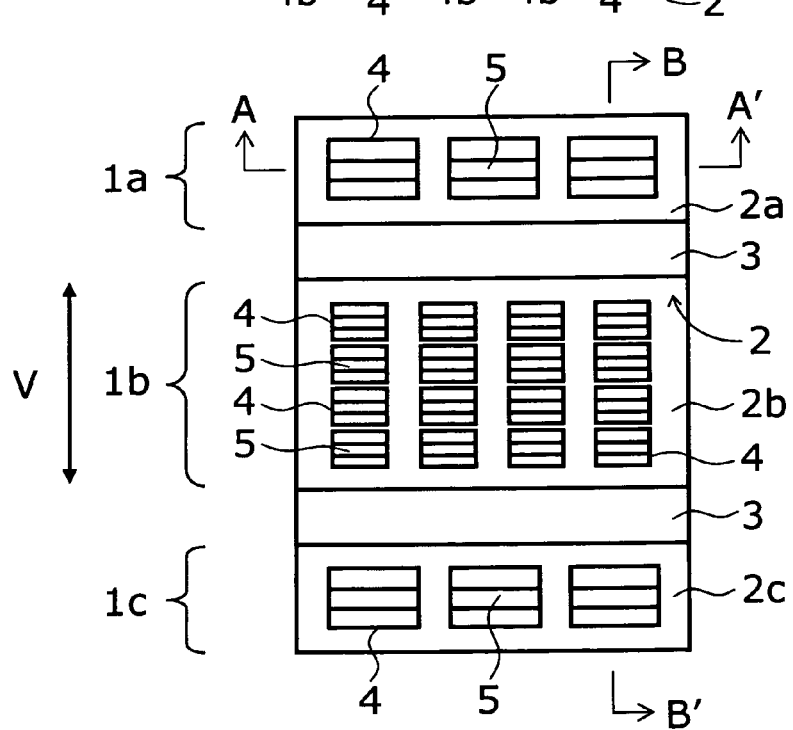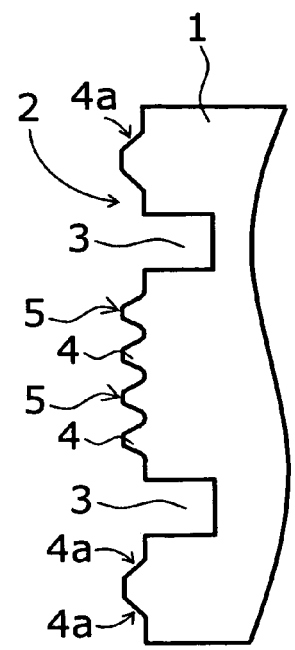
FIG. 1B
FIG. 1A
FIG. 1C

FIG. 2
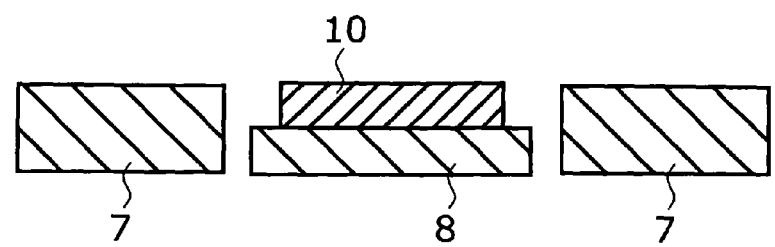
FIG. 3
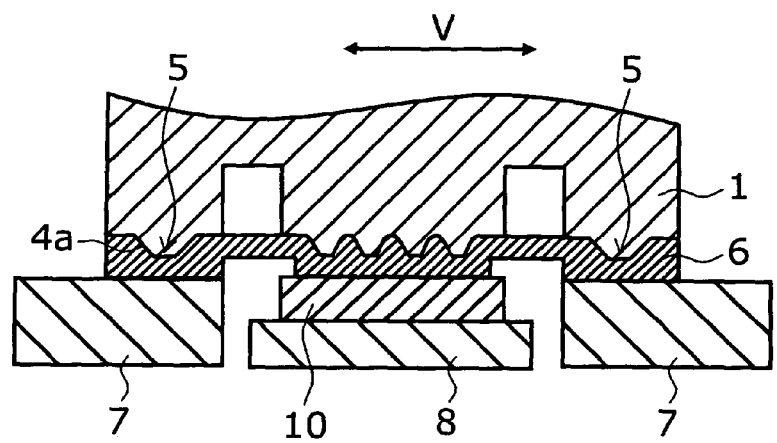
FIG. 4
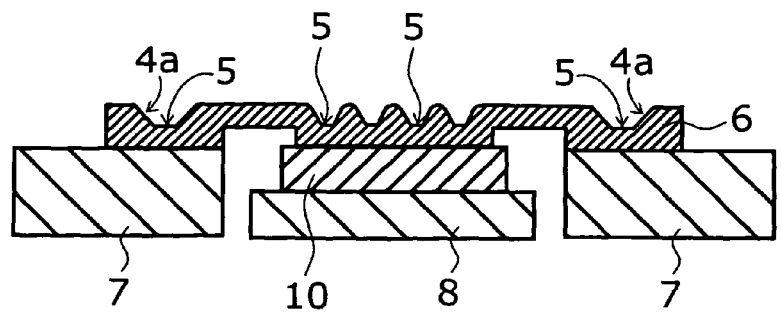

ULTRASONIC BONDING EQUIPMENT FOR MANUFACTURING SEMICONDUCTOR DEVICE, SEMICONDUCTOR DEVICE AND ITS MANUFACTURING METHOD

CROSS-REFERENCE TO RELATED APPLICATIONS

This application is based upon and claims the benefits of priorities from the prior Japanese Patent Application No. 2004-324640, filed on Nov. 9, 2004, and the prior Japanese Patent Application No. 2005-310170, filed on Oct. 25, 2005; the entire contents of which are incorporated herein by reference.

BACKGROUND OF THE INVENTION

1. Field of the Invention

This invention relates to an ultrasonic bonding equipment for manufacturing a semiconductor device, a semiconductor device and its manufacturing method. More specifically, the invention relates to the ultrasonic bonding equipment for electrically connecting a lead as an external terminal of a semiconductor device with a electrode provided on an upper surface of a semiconductor chip by a bonding strap having a shape of a plate, a ribbon or the like, and made of aluminum or the like, the semiconductor device manufactured thereby and its manufacturing method.

2. Background Art

A semiconductor device is known in which a lead extending as an external terminal of the semiconductor device is electrically connected with an electrode formed on a surface of a semiconductor chip by a bonding strap having a shape of a plate or a ribbon and made of aluminum or the like. In most instance, the bonding strap is connected to the surface of the semiconductor chip and to the lead consisting of a lead frame by an ultrasonic bonding equipment.

The conventional ultrasonic bonding equipment for manufacturing the semiconductor device has a tip portion (i.e. bonding-tool) for propagating ultrasonic vibration, which has a top surface which is faced to a member to be bonded. The top surface which is faced to the member to be bonded is planar and a plurality of top protruding portions having a shape of a quadrangular frustum are provided on the top surface (Japanese Laid-Open patent Application No. H9-108853 and No. 2002-314018). However, an operating rate of the conventional ultrasonic bonding equipment is low and a running cost is high because an exchange frequency of the bonding-tool is high due to a rapid wear-out of the inclined surface of the top protruding portions which propagate an ultrasonic vibration. Especially, the inclined surfaces of the top protruding portions, which are parallel to a vibration direction of the bonding-tool are worn rapidly.

It is described in a Japanese Laid-Open patent Application No. H5-235115 that the ultrasonic bonding equipment for manufacturing the semiconductor device having irregularities on a bonding surface of the bonding-tool makes it possible to obtain a higher reliable connections by ultrasonic vibration with a lower output power.

SUMMARY OF THE INVENTION

According to an aspect of the invention, there is provided An ultrasonic bonding equipment for manufacturing a semiconductor device comprising a tip portion, the tip portion having a top surface which is faced to a member to be bonded, the tip portion propagating an ultrasonic vibration to the top surface, a plurality of protruding portions being provided on the top surface, and each of the protruding portions having:
a first pair of opposite side surfaces inclined with respect to the top surface; and
a second pair of opposite side surfaces substantially vertical to the top surface.

According to other aspect of the invention, there is provided a semiconductor device comprising:
a semiconductor chip;
a lead; and
a bonding strap electrically connecting the semiconductor chip and the lead,
a recess being formed on an upper surface of the bonding strap in at least one of a first region where the bonding strap and the semiconductor chip are connected and a second region where the bonding strap and the lead is connected,
a first pair of opposite side surfaces of the recess being inclined with respect to the upper surface of the bonding strap, and
a second pair of opposite side surfaces of the recess being substantially vertical to the upper surface of the bonding strap.

According to other aspect of the invention, there is provided a method for manufacturing a semiconductor device comprising connecting a bonding strap to at least one of an electrode of a semiconductor chip and a lead by placing the bonding strap above at least one of the electrode and the lead, and by applying a load and an ultrasonic wave through a tip portion, which is in contact with the bonding strap, a plurality of protruding portions being provided on a top surface of the tip portion, each of the protruding portions having:
a first pair of opposite side surfaces inclined with respect to the top surface; and
a second pair of opposite side surfaces substantially vertical to the top surface, and
a direction of vibration of the ultrasonic wave is substantially parallel to the second pair of opposite side surfaces.

BRIEF DESCRIPTION OF THE DRAWINGS

FIGS. 1A through 1C are schematic views of a tip portion (i.e. bonding-tool) of an ultrasonic bonding equipment for manufacturing a semiconductor device in accordance with the invention, where FIG. 1A is a schematic plan view of a top surface facing a member to be bonded and FIGS. 1B and 1C are schematic partial cross sections. FIGS. 1B and 1C are sections taken along the line A'-A' and B-B' of FIG. 1A;

FIG. 2 is a schematic cross-sectional view showing a part of an assembly process of a semiconductor device comprising a bonding strap 6, leads 7 and a semiconductor chip 10 placed adjacent to each other;

FIG. 3 is a schematic cross-sectional view showing a part of the assembly process in which the tip portion of the embodiment is contacted on the bonding strap 6 provided on the leads 7 of a lead frame and on the semiconductor chip 10;

FIG. 4 is a schematic cross-sectional view showing a part of the assembly process in which the bonding strap 6 is bonded to the leads 7 of the lead frame and to the semiconductor chip 10;

FIGS. 5B and 5C are schematic partial cross sections and FIG. 5 A is a schematic plan view of a top surface facing a member to be bonded. FIGS. 5B and 5C are the cross sections taken along the line A'-A' and B-B' of FIG. 5 A, respectively;

FIGS. 10B and 10C are schematic partial cross sections of the bonding tool and FIG. 10A is a schematic plan view of a top surface which is faced to the member to be bonded. FIGS. 10B and 10C are sections taken along the line A'-A' and B-B' of FIG. 10A;

DETAILED DESCRIPTION OF THE INVENTION

Embodiment 1

Figure 5B:
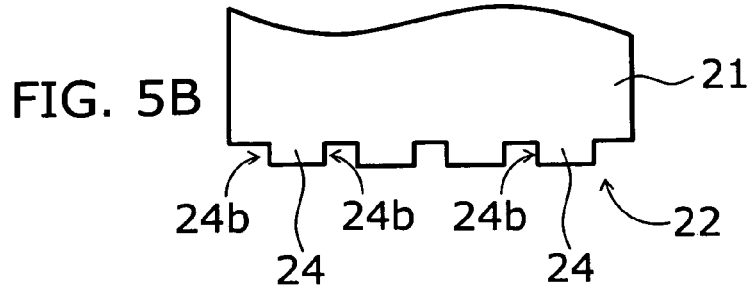
FIGS. 5A through 5C are schematic views of the tip portion (i.e. a bonding-tool) 21 for propagating ultrasonic vibration in the ultrasonic bonding equipment for manufacturing a semiconductor device in accordance with the second embodiment of the invention, where

A first embodiment of the invention is explained with reference to FIGS. 1A through 4.

FIGS. 1A through 1C are schematic views of a tip portion (i.e. bonding-tool) of an ultrasonic bonding equipment for manufacturing a semiconductor device in accordance with the invention, where FIG. 1A is a schematic plan view of a top surface facing a member to be bonded and FIGS. 1B and 1C are schematic partial cross sections. FIGS. 1B and 1C are sections taken along the line A'-A' and B-B' of FIG. 1A.

FIG. 2 is a schematic cross-sectional view showing a part of an assembly process of a semiconductor device comprising a bonding strap 6, leads 7 and a semiconductor chip 10 placed adjacent to each other.

FIG. 3 is a schematic cross-sectional view showing a part of the assembly process in which the tip portion of the embodiment is contacted on the bonding strap 6 provided on the leads 7 of a lead frame and on the semiconductor chip 10.

FIG. 4 is a schematic cross-sectional view showing a part of the assembly process in which the bonding strap 6 is bonded to the leads 7 of the lead frame and to the semiconductor chip 10.

FIGS. 1A through 1C show the bonding-tool 1 which is provided in an ultrasonic bonding equipment for manufacturing a semiconductor device and propagates an ultrasonic vibration. A plurality of top protruding portions 4 are formed on the top surface 2 of the bonding-tool 1. The top surface 2 is pressed to a member to be bonded (the bonding strap 6 in the embodiment) to be bonded. Subsequently, an ultrasonic wave vibration is applied along a direction of an arrow V as shown in FIG. 1 A.

The dimensions of the protruding portions 4 are (50–100 micrometers)×(100–200 micrometers) and a height of the protruding portion 4 is in a range of (50-200 micrometers), for example.

In either top protruding portion 4, a first pair of opposite side surfaces 4a are inclined surfaces which are inclined with respect to the top surface 2. In contrast, a second pair of opposite side surfaces 4b are substantially vertical to the top surface 2 and adjacent to the second pair of the inclined surfaces 4a. The upper surfaces 5 of the top protruding portions 4 are planar flat surfaces. Additionally, the top protruding portions are divided into a plurality of sections (section 1a though section 1c) and each section has a plurality of top protruding portions 4. In the specific example, three top protruding portions 4 are formed in the sections 1a and 1c, respectively, and sixteen top protruding portions 4 are formed in the section 1b.

The top protruding portions 4 in each section have the same size and same shape. Further, the top protruding portions 4 in at least one section have a different size and/or a different shape from the top protruding portions 4 in other sections. In this example, the top protruding portions 4 of the sections 1a and 1c have the same size and same shape, while the top protruding portions 4 of either section 1a or 1c have a different size and/or a different shape from the top protruding portions 4 of the section 1c. Those sections are separated by a trench 3 which is formed on the top surface 2 which faces a member to be bonded.

The top surface 2 which faces a member to be bonded comprises a first top surface 2a, a second top surface 2b and a third top surface 2c. Each of the top surfaces corresponds to the section 1a, 1b or 1c, respectively. The top protruding portions 4 of the section 1a and 1c have the same size and the same shape. In contrast, the top protruding portions 4 of the section 1b have smaller area than that of section 1a and 1c. This is because the material of the semiconductor chip 10 is different from the material of the lead frame, which are bonded with the bonding strap 6. The first top surface 2a and the third top surface 2c connect the bonding strap 6 to the lead 7 constituting the lead frame. The second top surface 2b connects the bonding strap 6 to an electrode of the semiconductor chip 10.

As describe above, the size and/or the shape of the top protruding portion 4 depends on a kind of material of the member to be bonded by the strap. In this embodiment, the bonding strap 6 is connected to the aluminum electrode of the semiconductor chip 10 and to the lead 7 constituting lead frame. As a result, low power consumption and high speed devices can be obtained because a wire resistance is decreased by using such a bonding strap 6. For example, aluminum can be used as materials of the bonding strap 6 and the electrode of the semiconductor chip 10. In contrast, copper or copper alloy can be used as a material of the lead 7. Connection between aluminum members can obtain easily. However, it is not easy to connect an aluminum member and a copper member. According to the embodiment, a bonding strength can be improved by providing the larger areas to the top protruding portions of the first top surface 2a and the third top surface 2c (the section 1a and the section 1c are provided) which connect aluminum with copper, as shown in FIGS. 1A through 1C. Furthermore, it is also possible to increase the pressing force on these sections during the bonding step.

The conventional ultrasonic bonding equipment comprises a bonding-tool which has a plurality of top protruding portions having a shape of a quadrangular frustum. In the case, the pair of opposite side surfaces in parallel to the vibrating direction are remarkably worn. Therefore, a life of the tip portion (bonding-tool) of the ultrasonic bonding equipment is extremely short. In contrast, the life of the tip portion of the ultrasonic bonding equipment of this embodiment is improved by making the angle between the top surface and the side surfaces which were conventionally worn heavily by the ultrasonic vibration 90 degrees or the like.

Next, manufacturing steps of the semiconductor device using the ultrasonic bonding equipment of the invention is explained with reference to FIG. 2 through FIG. 4.

The lead frame made of such as copper comprises the lead 7 and a chip mounting portion 8. The semiconductor chip 10 is mounted on the chip mounting portion 8 by an adhesion bond or the like. An end of lead is provided in a manner to face the semiconductor chip 10 as shown in FIG. 2. As the bonding-tool 1 of the ultrasonic bonding equipment descends, it touches the aluminum bonding strap 6 having a shape of a plate or a ribbon touches. Further, the bonding-tool 1 descends to a predetermined position, the bonding strap 6 touches the lead 7 and the electrode of the semiconductor chip 10. Then, the ultrasonic vibration along a direction shown by an arrow V and a load are applied. Consequently, the semiconductor chip 10 and the bonding strap 6 are connected, and the lead 7 and the bonding strap 6 are also connected simultaneously by the ultrasonic bonding as shown in FIG. 3. With regard to the load, the load applied to the semiconductor can be reduced and the load applied to the lead 7 can be increased by adjusting the vertical positions of the semiconductor chip 10 and the lead 7.

The vertical side surfaces of the top protruding portions 4 of the bonding-tool 1 are placed parallel to the direction of the ultrasonic vibration shown by arrow V in the step connecting the electrode of the semiconductor chip 10 with the bonding strap 6 and the lead 7 with the bonding strap 6, after the bonding tool 1 for propagating ultrasonic vibration comes in contact with the bonding-strap 6. The ultrasonic vibration amplitude of the bonding-tool 1 may be approximately in a range of 8-10 micrometers, for example.

After the lead 7 and the semiconductor chip 10 are connected to the bonding strap 6 as shown in FIG. 4, an encapsulation by a resin and the lead frame cutting process are performed and thus, the semiconductor device is completed.

According to the embodiment, it becomes possible to suppress the wearing of the bonding-tool due to ultrasonic vibration and to improve the life of the ultrasonic bonding-tool. Specifically, according to the embodiment, it becomes possible to improve the life of the bonding-tool by almost ten times longer than that of a conventional one which has the top protruding portions having a shape of quadrangular frustum. According to the embodiment, an operating time spent for the bonding process can be reduced to one half since the lead 7 and the semiconductor chip 10 are simultaneously connected the bonding strap 6 by the bonding-tool, and the life of the bonding-tool can be doubled.

Additionally, according to the embodiment, an area of upper surfaces of the top protruding portions are larger than that of the conventional top protruding portions having the shape of quadrangular frustum. This is because the top protruding portions of the embodiment have a pair of vertical side faces. As the area of the upper surfaces becomes lager, the bonding strength becomes higher because the upper surfaces 5 correspond to the actually bonded regions. Consequently, a mechanical strength of the semiconductor device manufactured by ultrasonic bonding equipment of this embodiment is higher than that of the semiconductor device manufactured by the conventional bonding equipment. specifically, comparing with the conventional bonding-tool, it turns out that a breaking strength on a shearing test is increased by more than thirty percent.

Embodiment 2

Next, second embodiment is explained with a reference to FIGS. 5A through 9.

Figure 5A:
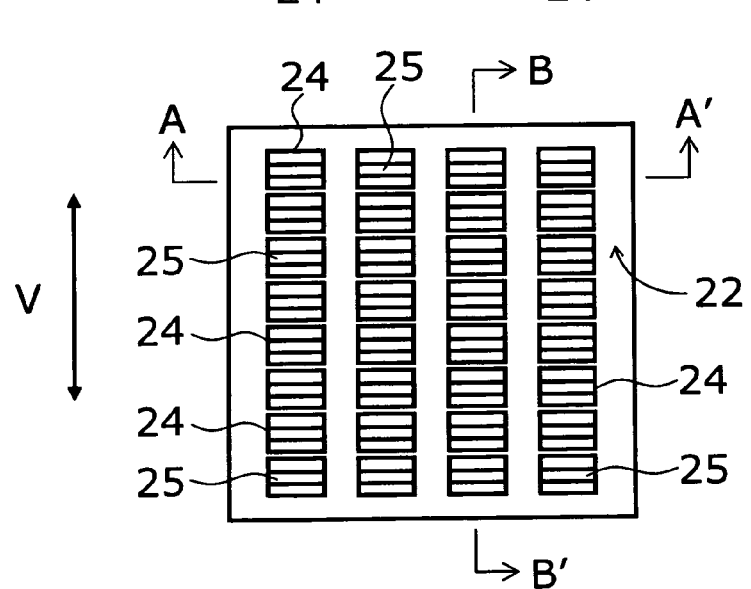
Figure 5C:
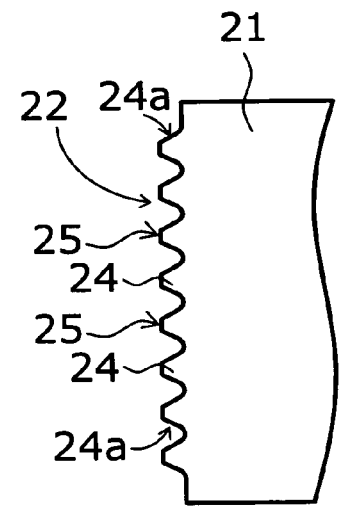

FIGS. 5A through 5C are schematic views of the tip portion (i.e. a bonding-tool) 21 for propagating ultrasonic vibration in the ultrasonic bonding equipment for manufacturing a semiconductor device in accordance with the second embodiment of the invention, where FIGS. 5B and 5C are schematic partial cross sections and FIG. 5A is a schematic plan view of a top surface facing a member to be bonded. FIGS. 5B and 5C are the cross sections taken along the line A'-A' and B-B' of FIG. 5A, respectively.

In this example, the top protruding portions which are provided the top surface facing a member to be bonded is not separated into a plurality of sections. Namely, the bonding-tool of the first embodiment as described above is used to connect three bonding parts simultaneously by the ultrasonic bonding. In contrast, the bonding-tool of the second embodiment is used to connect only one part at a time.

More specifically, the bonding-tool shown in FIGS. 5A through 5C has a top surface 22 which is faced to a member to be bonded. A plurality of top protruding portions 24 are formed on the top surface 22. In either top protruding portion 24, a first pair of opposite side surfaces 24a are inclined with respect to the top surface 22. A second pair of side surfaces 24b adjacent to the side surfaces 24a are vertical to the top surface 22. Upper surfaces 25 of the top protruding portions 24 are planar flat surfaces. Unlike the aforementioned embodiment 1, these top protruding portions 24 are not separated into a plurality of sections. All of the top protruding portion 24 have a same size and a same shape.

Unlike the aforementioned embodiment 1, the top surface 22 which is faced to a member to be bonded is not separated into a plurality of parts. By using this bonding-tool 21, a bonding step for bonding the strap 6 and the lead 7 and a bonding step for bonding the bonding strap 6 and the electrode of the semiconductor chip 10 are performed separately. When the ultrasonic bonding is performed, an ultrasonic wave whose vibration direction is shown by an arrow V as shown in FIG. 5A is applied. A bonding condition can be appropriately adjusted to be optimum in case where a material of the electrode of the semiconductor chip 10 and a material of the lead 7 are different.

The conventional ultrasonic bonding equipment comprised the bonding-tool having a plurality of top protruding portions which has a shape of a quadrangular frustum. In the case, the side surfaces of the top protruding portions are remarkably worn. Especially, the side surfaces parallel to the vibrating direction are rapidly worn. As a result, a life of the bonding-tool is quite short.

In contrast, according to the embodiment, it becomes possible to suppress the rapid wear-out of the boding-tool by making the side surfaces, which have been rapidly worn conventionally, of the top protruding portions 24 substantially vertical to the top surface 22.

Next, steps for manufacturing semiconductor device with the ultrasonic bonding equipment of this invention are explained as follows.

Figure 6:
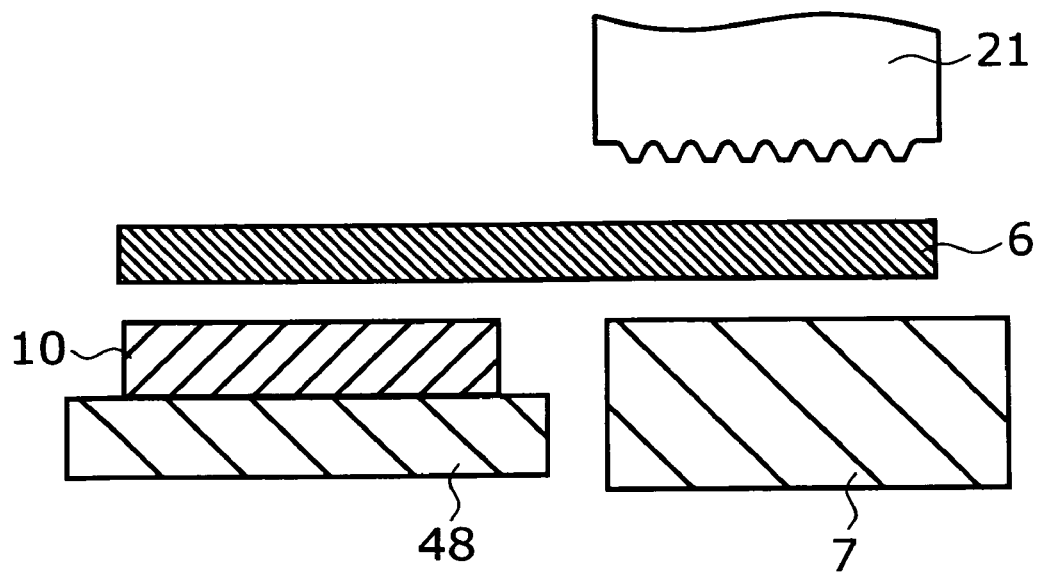
FIGS. 6 through 9 are the sections showing the manufacturing steps of the semiconductor device in accordance with the second embodiment of the invention.
Figure 7:
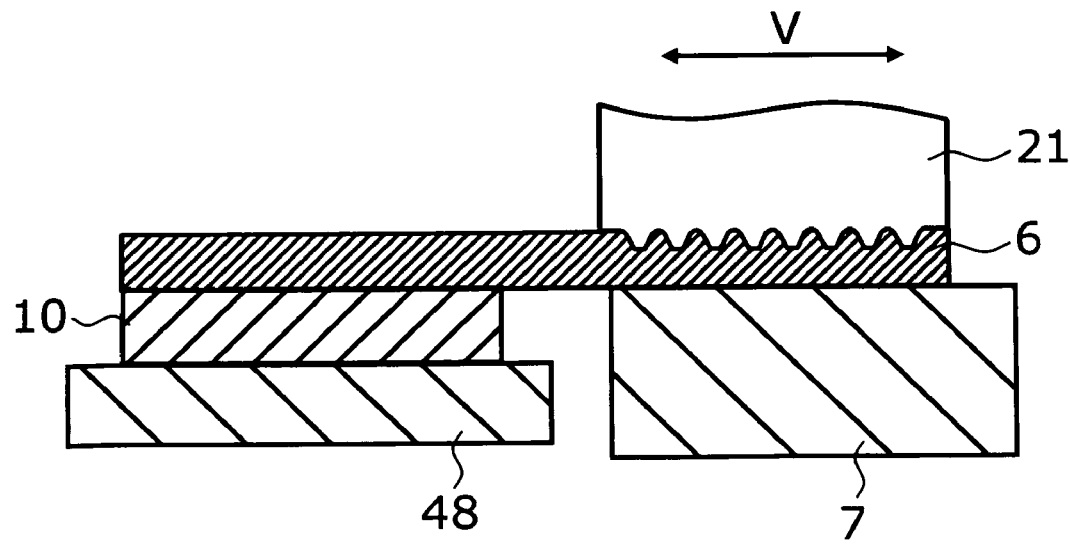

FIGS. 6 through 9 are the sections showing the manufacturing steps of the semiconductor device in accordance with the embodiment. As shown in FIG. 6, the lead frame, which is made of copper or the like, comprises the lead 7 and the chip mounting portion 48. The semiconductor chip 10 is mounted on the chip mounting portion 48 by an adhesion bond. Tip portions of the lead 7 face the semiconductor chip 10. The aluminum bonding strap 6 having a shape of a plate or a ribbon touches the bonding-tool 21 as the bonding-tool descends. Then, as shown in FIG. 7, as the bonding-tool 21 descends to a predetermined position, the bonding strap 6 touches the lead 7. Then, the bonding strap 6 and the lead 7 are ultrasonically connected by applying an ultrasonic vibration and a load.

Figure 8:
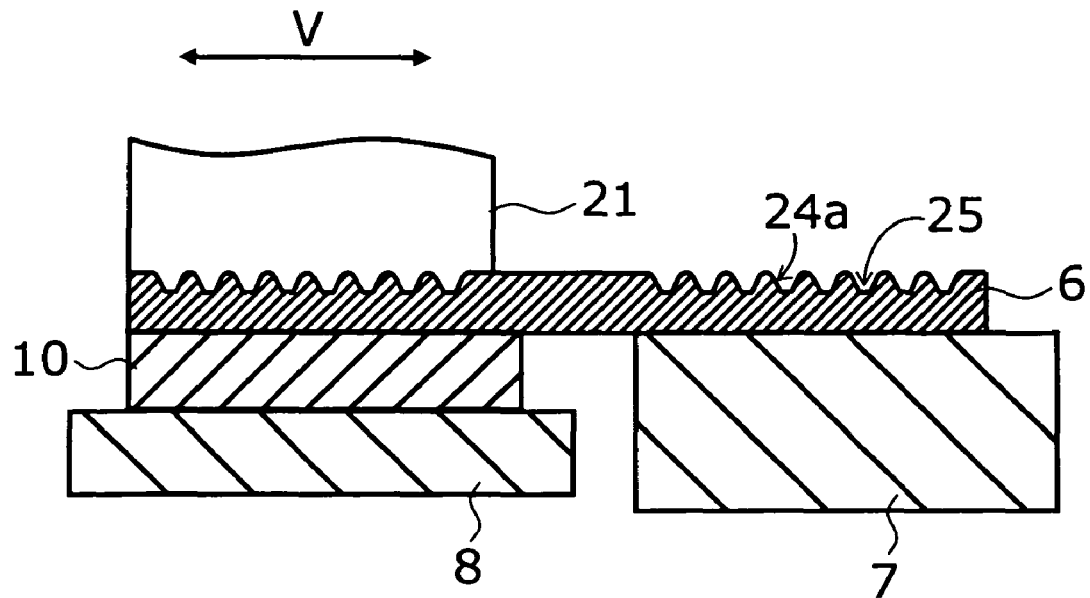
Figure 9:
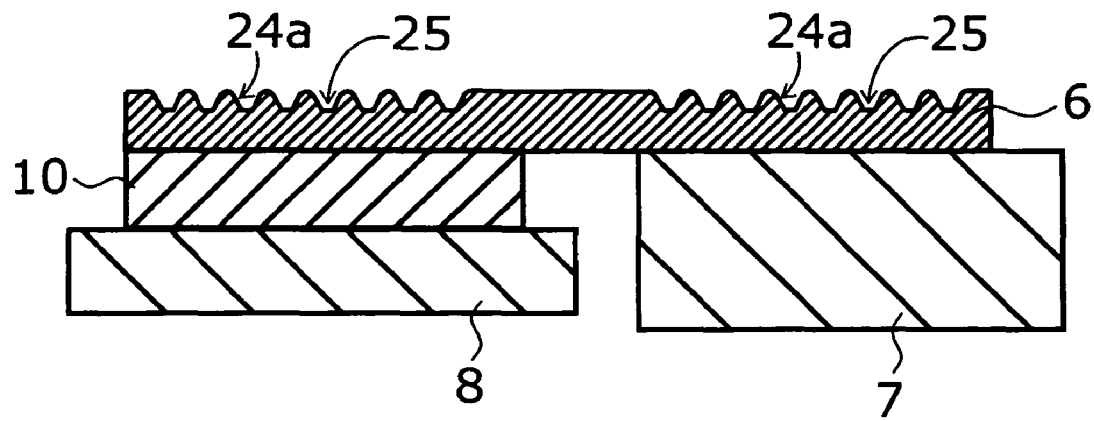

Next, as the bonding-tool 21 descends on the bonding strap 6 at the portion of the semiconductor chip 10 and the ultrasonic vibration and the load are applied, the bonding strap 6 is connected to the semiconductor chip 10 by the ultrasonic bonding, as shown in FIG. 8. Thus, the bonding strap 6 is connected to both of the lead 7 and semiconductor chip 10, as shown in FIG. 9. In the above-described steps, vertical side surfaces 24b of the tip portions 24 of the bonding-tool 21 are placed in parallel to vibrating direction V of bonding-tools 21 as shown in FIGS. 7 and 8. The steps shown in FIGS. 7 and 8 may be performed in a reverse order.

After connecting the bonding strap 6, encapsulation by a resin and the lead frame cutting steps are performed, and thus the semiconductor device is completed.

According to the embodiment, it becomes possible to suppress the wearing of the bonding-tool by sonic vibration and to double the life of the ultrasonic bonding tool.

Embodiment 3

Next, third embodiment is explained with reference to FIGS. 10A through 10C.

Figure 10B:
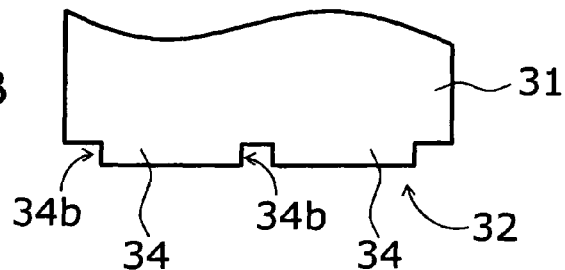
FIGS. 10A through 10C are schematic views illustrating the tip portion 31 (i.e. an ultrasonic vibrating bonding-tool) of the ultrasonic bonding equipment for manufacturing a semiconductor device in accordance with the third embodiment of the invention, where
Figure 10A:
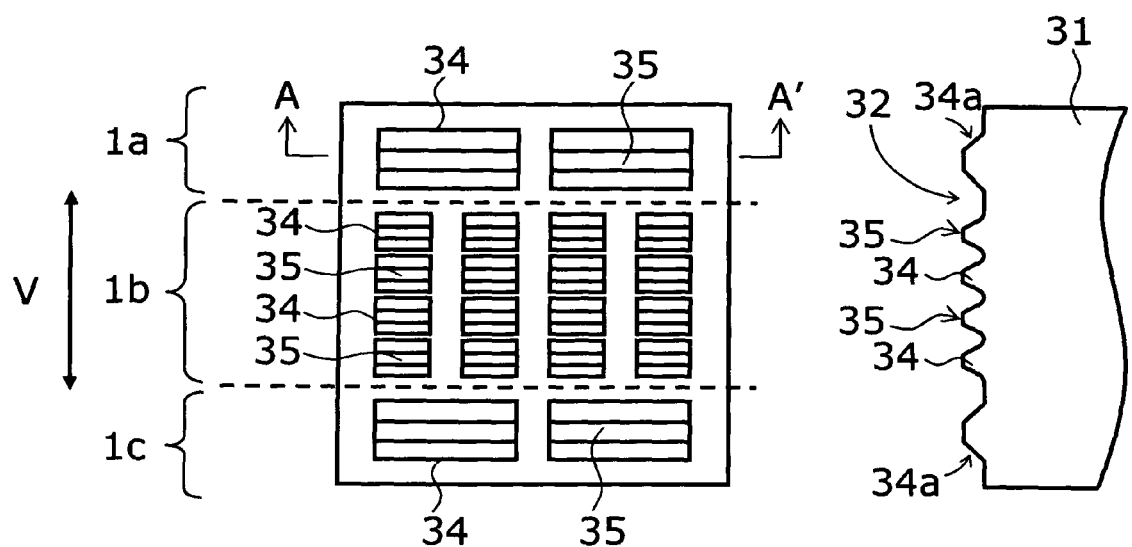
Figure 10C:
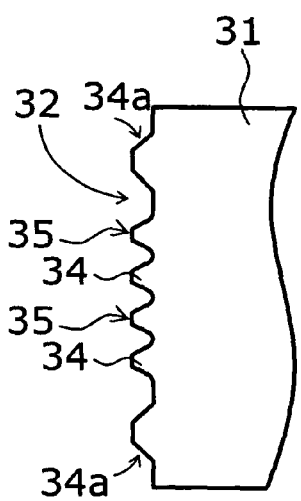

FIGS. 10A through 10C are schematic views illustrating the tip portion 31 (i.e. an ultrasonic vibrating bonding-tool) of the ultrasonic bonding equipment for manufacturing a semiconductor device in accordance with the third embodiment of the invention, where FIGS. 10B and 10C are schematic partial cross sections of the bonding tool and FIG. 10A is a schematic plan view of a top surface which is faced to the member to be bonded. FIGS. 10B and 10C are sections taken along the line A'-A' and B-B' of FIG. 10A.

The top surface which is faced to a member to be bonded in this embodiment is not separated into a plurality of top surfaces unlike the aforementioned first embodiment. However, the top protruding portions are separated into three sections as the first embodiment. Further, an area of the top protruding portions at which a higher bonding strength is required is made larger than that of the first embodiment. Each section is provided to connect to a different region, respectively.

More specifically, the bonding-tool shown in FIGS. 10A through 10C has the top surface 32 which is faced to a member to be bonded. A plurality of top protruding portions 34 are provided on the top surface 32. In every top protruding portion 34, a first pair of opposite side surfaces 34a are inclined with regard to the top surface 32, and a second pair of opposite side surfaces 34b adjacent to the side surfaces 34a are vertical to the top surfaces 32. Upper surfaces 35 of the top protruding portions 34 are planar.

The top protruding portions 34 are separated into a plurality of sections (section 1a to section 1c), and each section includes a plurality of top protruding portions 34. In the example shown in FIGS. 10A through 10C, two top protruding portions 34 are formed on the section 1a and 1c, respectively. Sixteen top protruding portions 4 are formed on the section 1b. The top protruding portions 34 in each section have the same size and same shape. The protruding portions 34 in at least one section have a different size and/or a shape from that of other section. In the specific example, the top protruding portions 34 of section 1a and 1c have the same size and shape, while the top protruding portions 34 of either section 1a or 1c have different size and/or shape from that of section 1b. This is because material of the member to be bonded with the strap differs from that of the other member to be bonded with the strap. Namely, the size and shape of the top protruding portions 34 separated into sections may be appropriately decided in respect to a material of the member to be bonded with the strap.

The conventional ultrasonic bonding equipment comprised the bonding-tool having a plurality of top protruding portions having a shape of a quadrangular frustum. In the case, the side surfaces of the top protruding portions are remarkably worn. Especially, the side surfaces parallel to the vibrating direction are rapidly worn. As a result, a life of the bonding-tool is quite short.

In contrast, according to the embodiment, it becomes possible to suppress the rapid wear-out of the boding-tool by making the side surfaces, which have been rapidly worn conventionally, of the top protruding portions 34 substantially vertical to the top surface 32. Especially, bonding strength at the sections 1a and 1c can be made larger than that of the aforementioned embodiment 1 because the area of protruding portions in sections 1a and 1c is larger than that of the first embodiment.

Next, manufacturing steps of the semiconductor device using the ultrasonic bonding equipment of present embodiment is explained. The lead frame made of copper or the like comprises the leads 7 and a chip mounting portion 8 as explained with reference to in FIG. 2. The semiconductor chip 10 is mounted on the chip mounting portion 8 by an adhesion bond or the like. The ends of the leads 7 are arranged in a manner to face the semiconductor chip 10. The aluminum bonding strap 6 having a shape of a plate or a ribbon touches the bonding-tool 31 of the ultrasonic bonding equipment, as the bonding-tool 31 descends. As explained with reference to FIG. 3, as the bonding-tool 31 descends to a predetermined position, the bonding strap 6 touches the lead 7 and the electrode of the semiconductor chip 10, and an ultrasonic vibration and a load are applied.

As a result, as shown in FIG. 4, the semiconductor chip 10 and the bonding strap 6 are connected, and the lead 7 and the bonding strap 6 are also connected by the ultrasonic bonding simultaneously. Vertical side surfaces 34b of the top protruding portions 34 of the bonding-tool 31 are parallel to a direction of a vibration direction V in a step connecting the electrode of the semiconductor chip 10 with the bonding strap 6 and the lead 7 with the bonding strap 6, when the bonding tool 31 propagates ultrasonic vibration to the bonding strap 6.

After connecting the bonding strap 6, encapsulation by a resin and the lead frame cutting steps are performed, and thus the semiconductor device is completed.

According to the embodiment, it becomes possible to suppress wearing of the bonding-tool by ultrasonic vibration and to improve the life of the ultrasonic bonding-tool. More specifically, the life of the bonding-tool can be doubled when the lead 7 and the semiconductor chip 10 are simultaneously connected with the bonding strap 6 by the ultrasonic bonding equipment.

Embodiment 4

Next, fourth embodiment of the invention is explained with reference to FIGS. 11 through 21.

Figure 11:
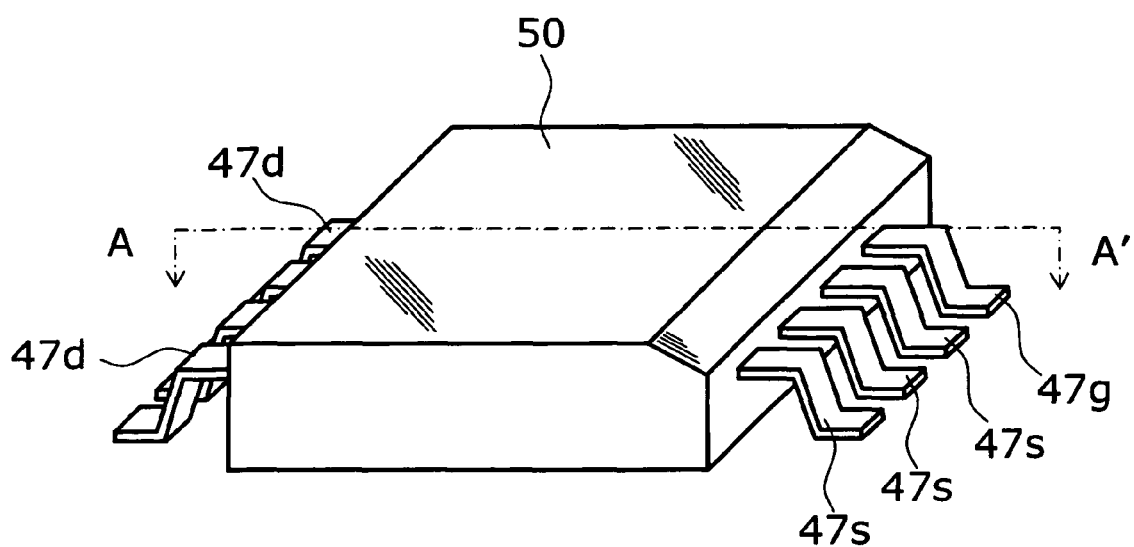
FIG. 11 is a perspective view of the semiconductor device manufactured by the ultrasonic bonding equipment for manufacturing the semiconductor device in accordance with the embodiment of the invention.

FIG. 11 is a perspective view of the semiconductor device manufactured by the ultrasonic bonding equipment for manufacturing the semiconductor device in accordance with the embodiment of the invention.

Figure 12:
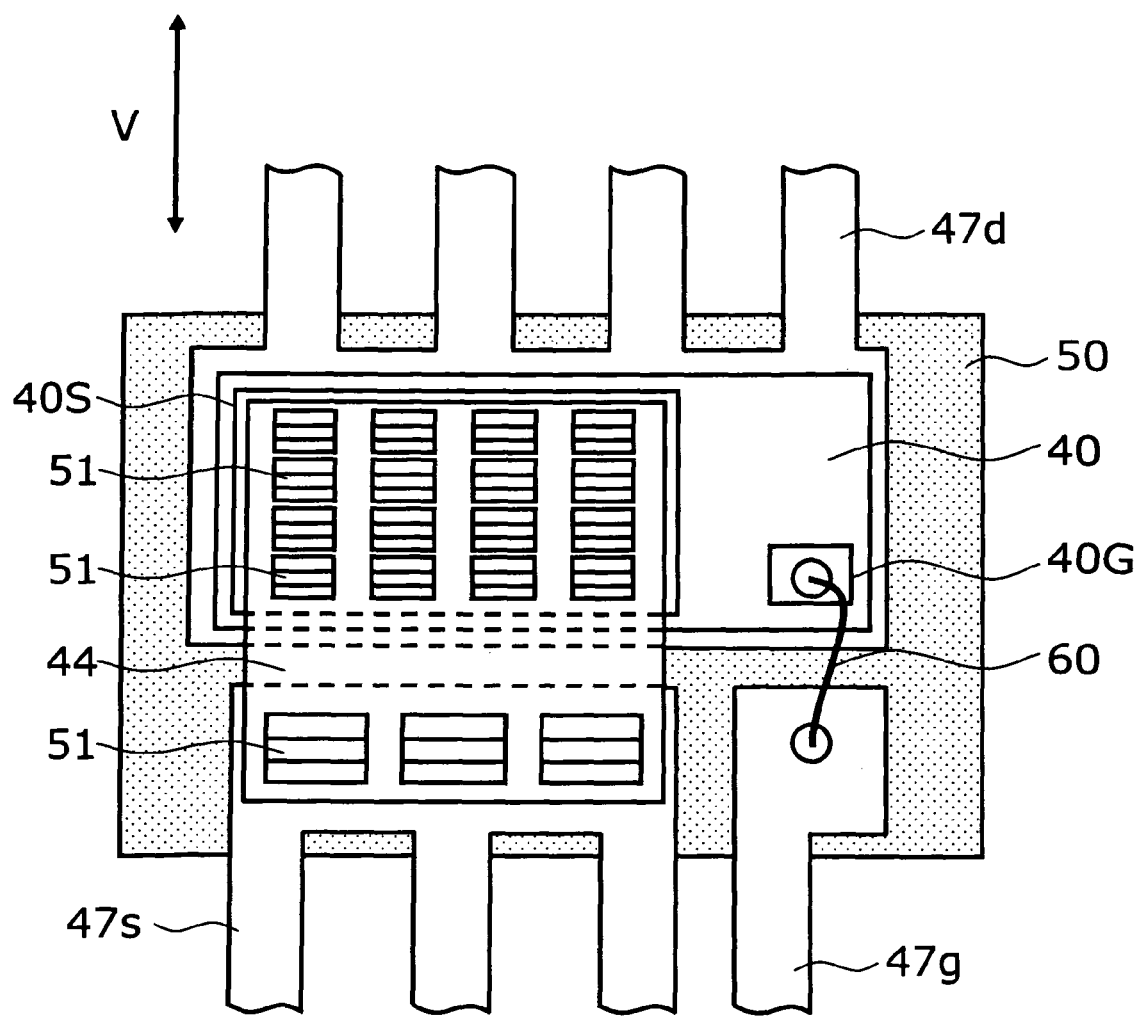
FIG. 12 is a plane of a view of the semiconductor device where an upper part of the plastic package 50 is removed.

FIG. 12 is a plane of a view of the semiconductor device where an upper part of the plastic package 50 is removed.

Figure 13:
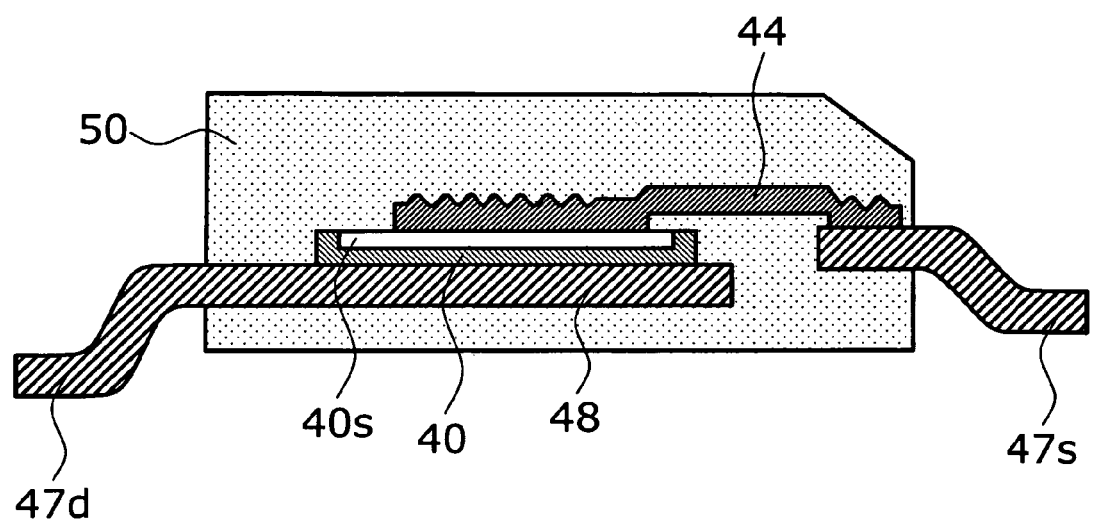
FIG. 13 is a section taken along the line A-A of FIG. 11.

FIG. 13 is a section taken along the line A-A of FIG. 11.

The lead frame of the semiconductor device manufactured by the ultrasonic bonding equipment of the embodiment has a unique structure. Namely, one of the leads 7 continuously extends without being separated from the chip mounting portion 48. The specific example of the semiconductor device is such as a power MOSFET (Metal-Oxide Semiconductor Field Effect Transistor) of a type of SOP (Small Outline Package)-8 package. A part of the drain terminal 47d, a part of the source terminal 47s, the semiconductor chip 8 and the bonding strap 44 are molded in a sealing resin 50 made of epoxy resin or the like.

As shown in FIGS. 12 and 13, the lead frame includes a gate terminal (i.e. leads) 47g, a source terminal 47s, a drain terminal 47d and a chip mounting portion 48. The drain terminal 47d and the chip mounting portion 48 have a plurality of leads, respectively.

A semiconductor chip (i.e. MOSFET) 40 made of silicon is bonded to chip mounting portion 48 which is continuously connected with the drain terminal 47d. The drain electrode is formed on a back side (not shown) of the semiconductor chip 40 and is electrically connected to drain terminal 47d via the chip mounting portion 48. The source electrode 40s is formed on a major plane of the semiconductor chip 40. The source terminal 47s is provided so as to face the chip mounting portion 48, and is electrically connected to the source electrode 40s by the bonding strap 44. A source electrode 40s is provided adjacent to A gate electrode 40g on a major plane of the semiconductor chip 40. The gate electrode 40g is electrically connected to a gate terminal 47g by a wire 60.

A top surface of a bonding-tool used in order to connect the bonding strap 44 with the semiconductor chip 40 and source terminal 47s of the semiconductor device is divided into two sections. A plurality of protruding portions are provided on each of the sections. The bonding-tool can be obtained by removing the section 1a or 1c from the bonding-tool shown in FIGS. 1A through 1C, for instance. The bonding strap 44 is simultaneously connected to the source electrode 40s and the source terminal 47s by using such a bonding-tool. When the ultrasonic bonding is performed, the vertical side surfaces of the protruding portions formed on the bonding-tool are arranged in parallel to the vibrating direction V of the bonding tool. Thus, the recesses 51 are periodically formed on the bonding strap 44 connected to the source electrode 40s and the source terminal 47s, respectively.

Optimum conditions to connect the bonding strap 44 differ in case where different materials are used for the source electrode 40s and the source terminal 47s. According to the embodiment, it becomes possible to connect the bonding strap 44 simultaneously to both of the source electrode 40s and the source terminal 47s by appropriately setting the size and/or the shape of the top protruding portions formed on each section of the top face of the bonding-tool, as explained with reference to FIGS. 1A through 1C. As a result, a lead time for the bonding process can be cut in half.

The source terminal 47s and the drain terminal 47d may not necessarily be disposed on a same plane, and may be disposed so as to be in different heights.

Figure 14:
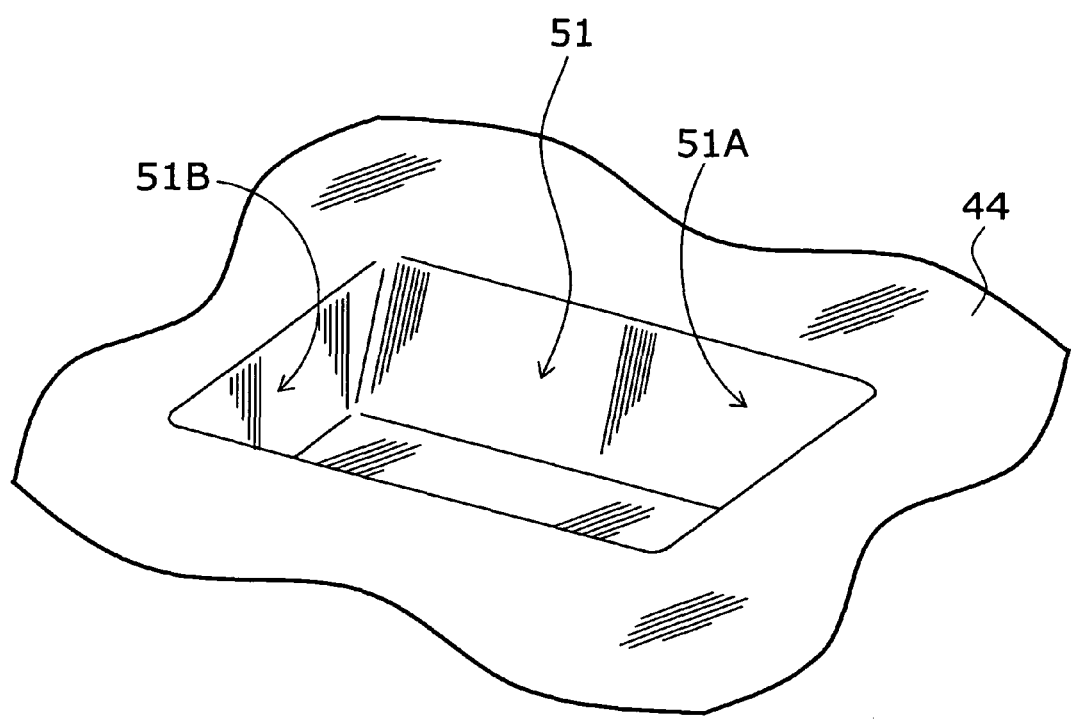
FIG. 14 is a perspective view of a recess 51 formed by the bonding-tool for propagating ultrasonic vibration of the ultrasonic bonding equipment for manufacturing the semiconductor device in accordance with the embodiment of the invention.
Figure 15:
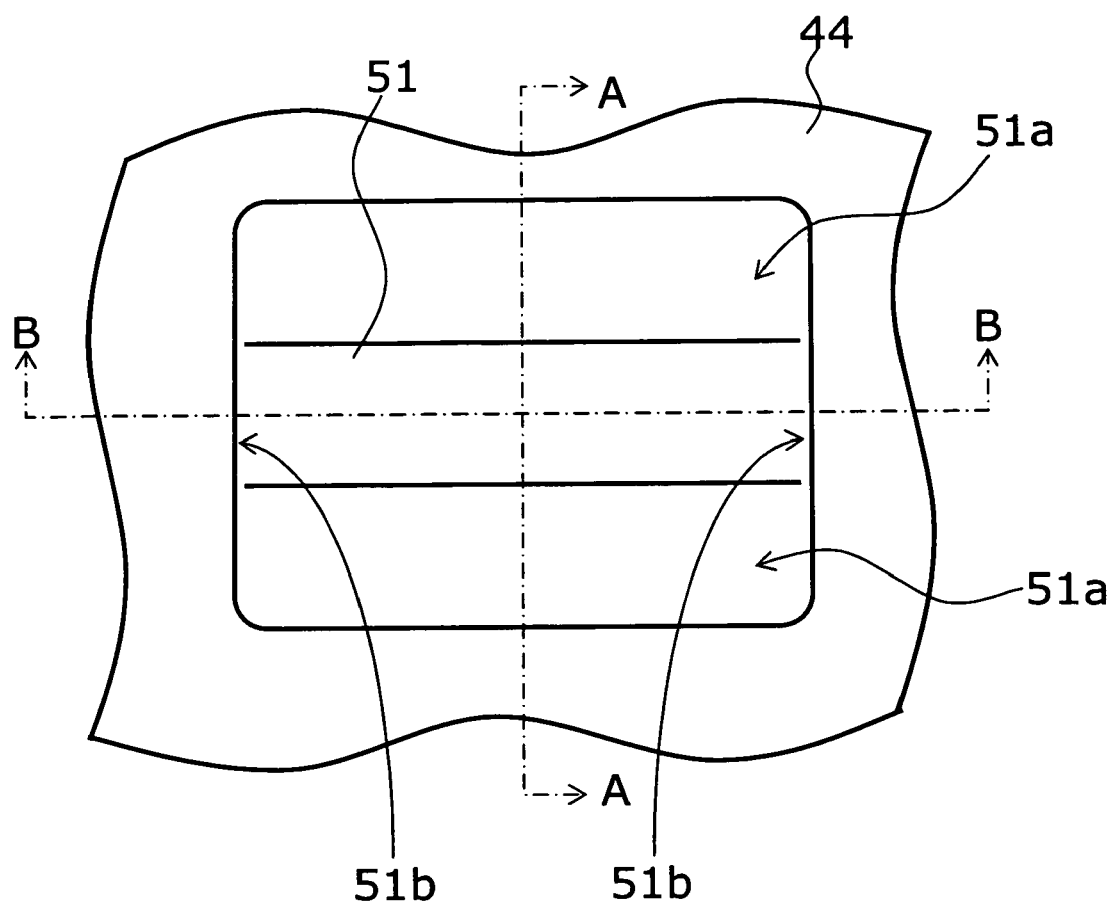
FIG. 15 is a plane view of recess 51 of FIG. 14.

FIG. 14 is a perspective view of a recess 51 formed by the bonding-tool for propagating ultrasonic vibration of the ultrasonic bonding equipment for manufacturing the semiconductor device in accordance with the embodiment of the invention;

FIG. 15 is a plane view of recess 51 of FIG. 14.

Figure 16:
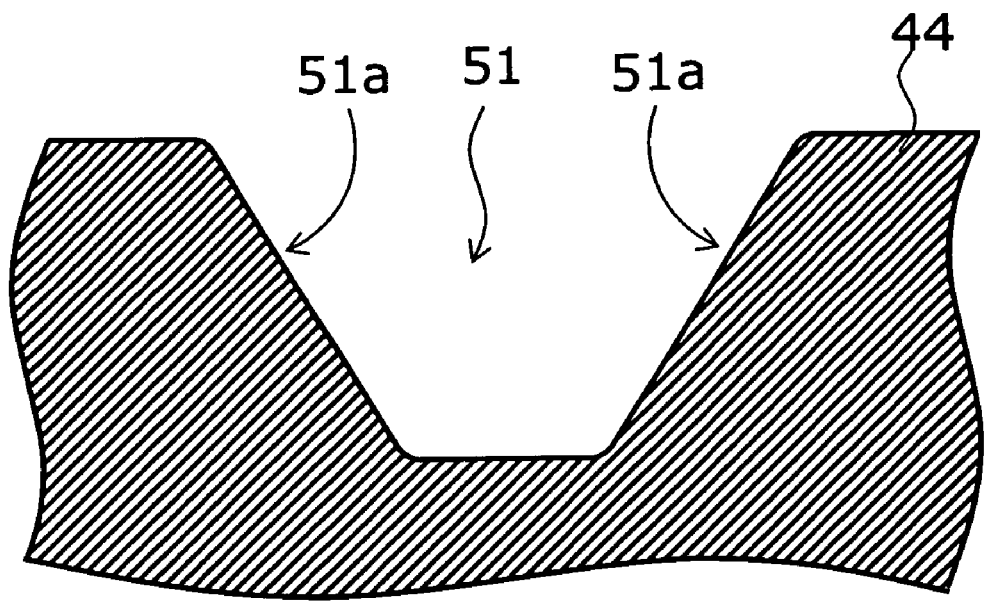
FIG. 16 is a section taken along the line A-A of FIG. 15.

FIG. 16 is a section taken along the line A-A of FIG. 15.

Figure 17:
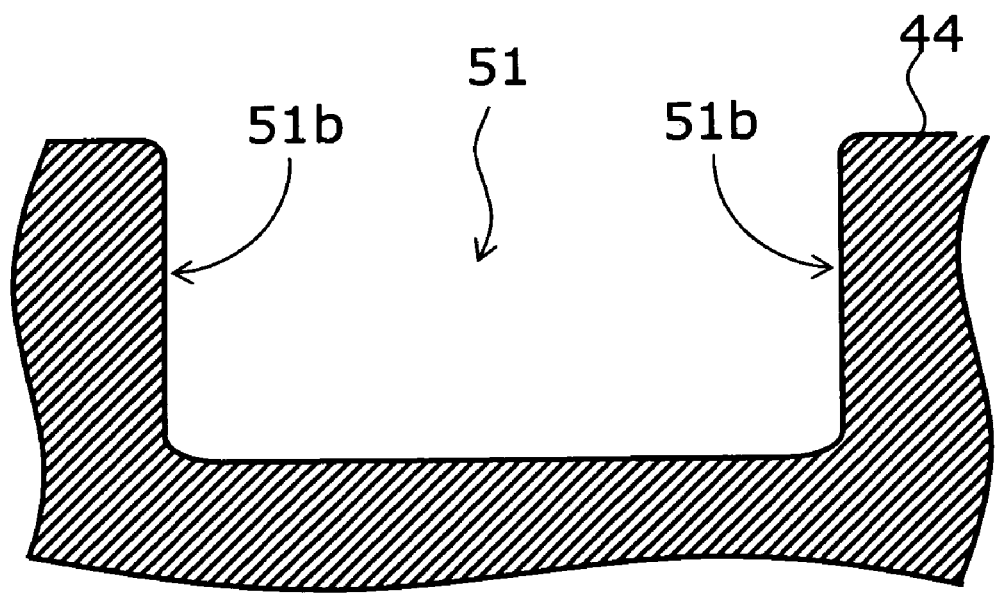
FIG. 17 is a section taken along the line B-B of FIG. 15.

FIG. 17 is a section taken along the line B-B of FIG. 15.

The recesses 51 have a shape which corresponds to a shape of the top protruding portions (for example, the top protruding portions 4 as shown in FIGS. 1A through 1C) formed on the top surface of the bonding-tool. Namely, the first pair of opposite side surfaces 51a and 51a facing the recess 51 are inclined with respect to the major surface of the bonding strap 44 and the second pair of opposite side surfaces 51b and 51b are substantially vertical to the major surface of the bonding strap 44.

The depths of the recesses 51 are about one half of the height of the top protruding portions in many cases, when excellent results are obtained. For example, the depth of the recess 51 is about 50 micrometers when the height of the protruding portions of the bonding-tool is 100 micrometers. However, the invention is not limited to this range, and the depths of recesses 51 are also encompassed within the scope of the invention. Additionally, any shape of the opening of the recesses 51, any balance of longitudinal size and transversal size, any balance of size of opening and the depth of the recesses 51, any angle of the inclined side surfaces 51a and the like that are adapted by those skilled in the art are also encompassed within the scope of the invention.

The bonding strength according to the embodiment of the invention can be made higher than that of the conventional one as the recesses 51 having the original shape are formed on the bonding strap during the boding process. It becomes possible to increase a breaking strength on shearing test by more than thirty percent, when compared with a semiconductor device manufactured by using a conventional bonding-tool having top protruding portions of a quadrangular frustum shape.

Further, a sufficiently high boding strength can be achieved by appropriately setting the sizes and/or the shapes of the recesses 51 formed above the source electrode 40s and the source terminal 47s, respectively. Further, a lead time of a boding process can be shortened, and a cost manufacturing the semiconductor devise can be reduced.

A pattern of the recesses 51 formed when the bonding strap 44 is connected to the semiconductor chip 40 and the source electrode 40s is not limited to the specific example shown in FIG. 12.

Figure 18:
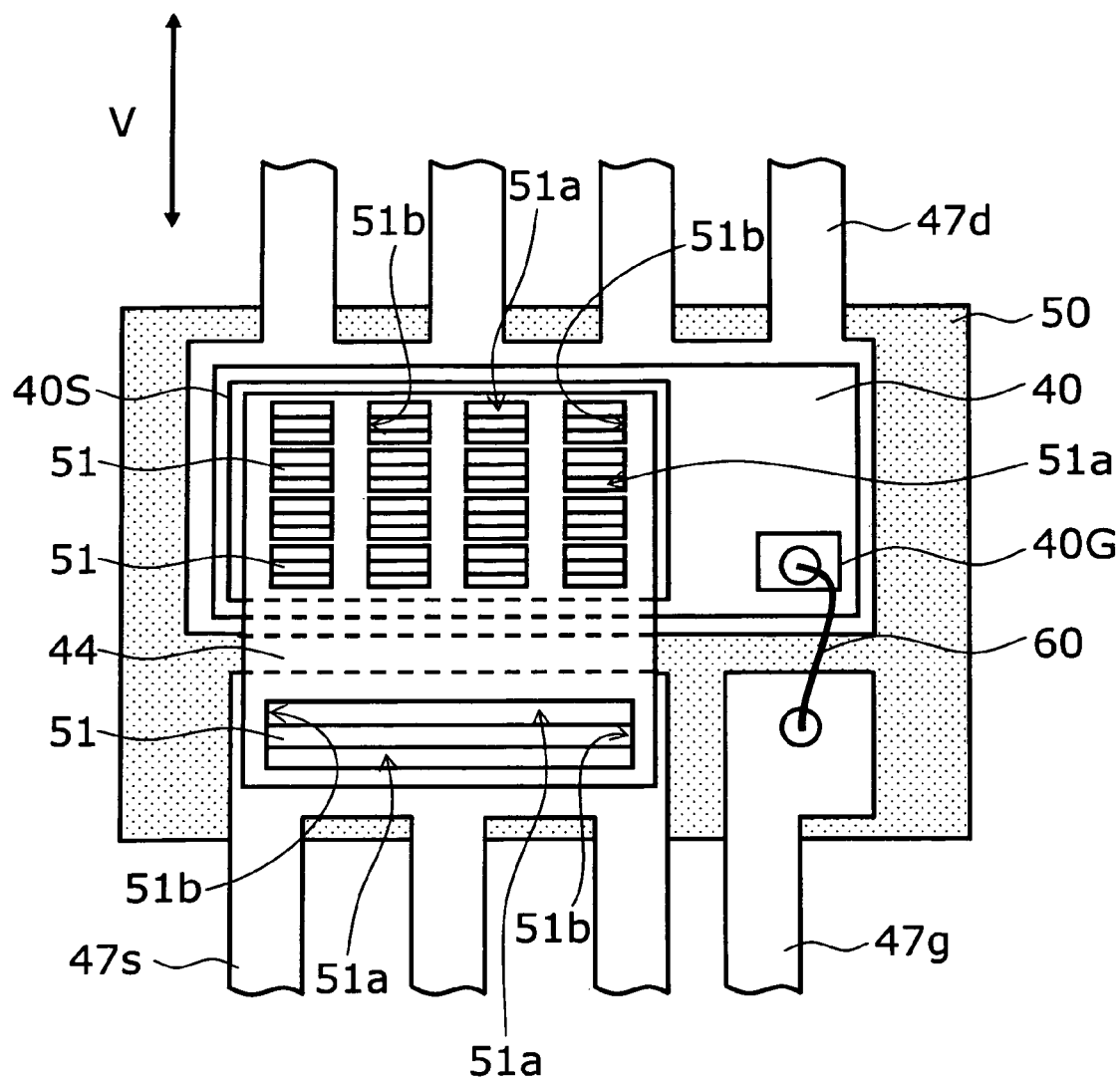
FIG. 18 shows an example where the recess 51 is summarized into unity on the source terminal 47s.

For example, as shown in FIG. 18, the recess 51 can be summarized into unity on the source terminal 47s.

Figure 19:
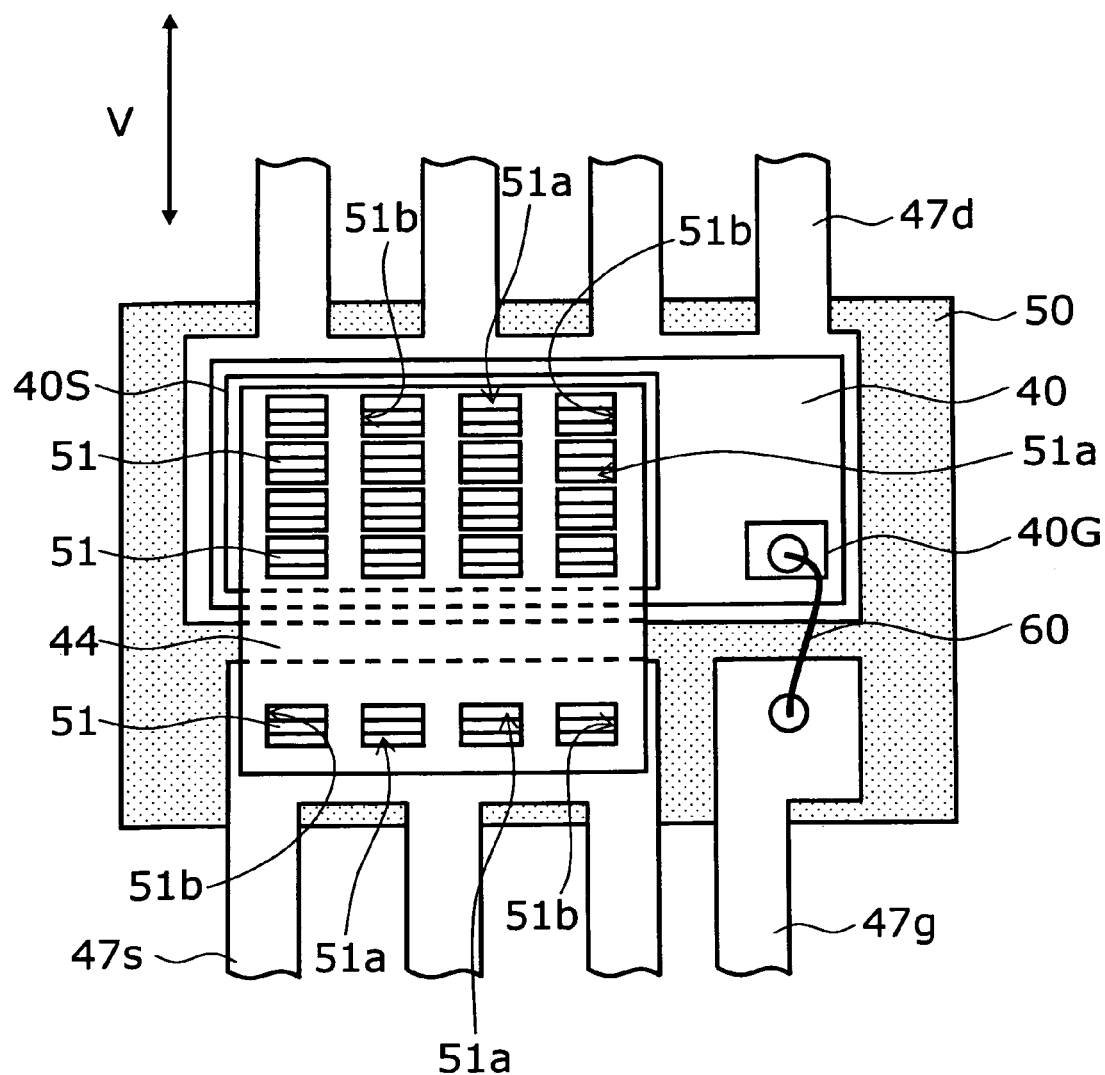
FIG. 19 shows an example where all the recesses 51 formed on the source electrode 40s and the source terminal 47s have the same size and/or the same shape.

As shown in FIG. 19, all the recesses 51 formed on the source electrode 40s and the source terminal 47s may have the same size and/or the same shape.

Figure 20:
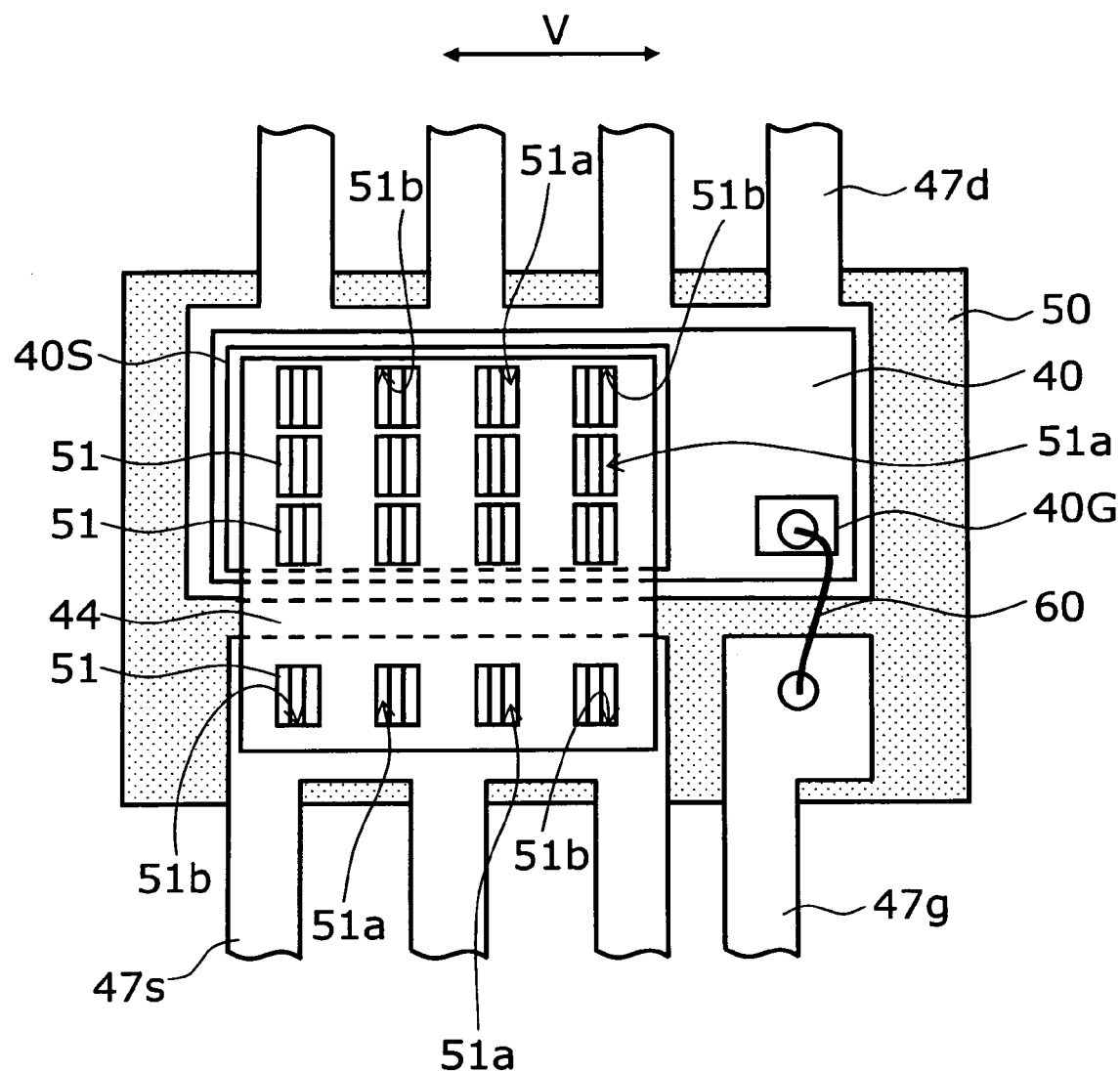
FIG. 20 shows an example where a direction of the recess 51 is set so that two vertical opposite side surfaces of the recesses 51 are approximately vertical to a direction along which the source electrode 40s and the source terminal 47s are provided.

Further, as shown in FIG. 20, a direction of the recess 51 can be set so that two vertical opposite side surfaces of the recesses 51 are approximately vertical to a direction along which the source electrode 40s and the source terminal 47s are provided. In the specific case, a direction of the vibration of the ultrasonic wave applied to the bonding-tool (not shown) is shown by the arrow V in FIG. 20.

Figure 21:
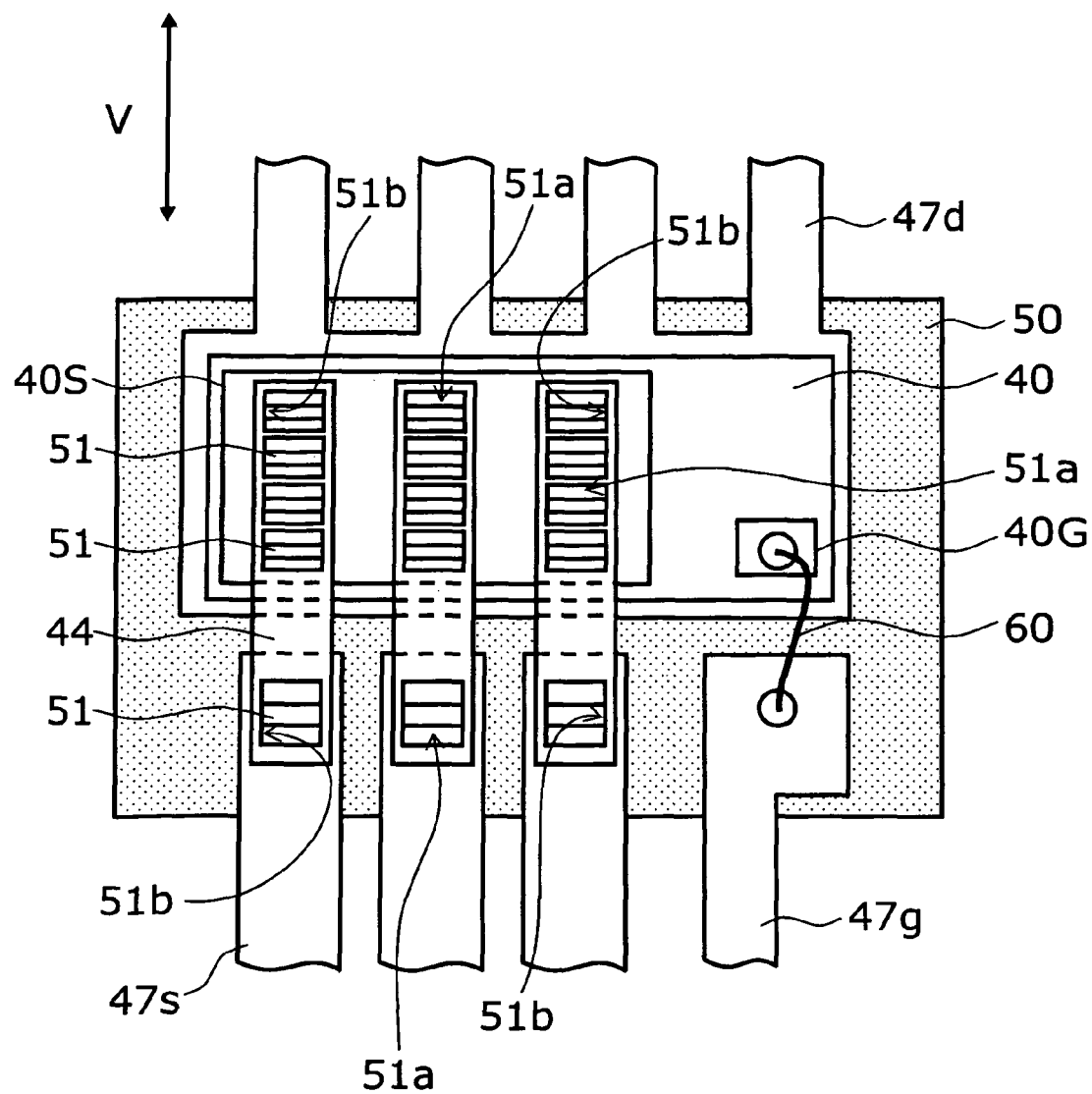
FIG. 21 shows an example where the semiconductor device includes three bonding straps 44 which are connected with three pieces of the source terminals 47s, respectively.

In the case of the example shown in FIG. 21, the semiconductor device includes three bonding straps 44 which are connected with three pieces of the source terminals 47s, respectively. The same advantages can be obtained according to the embodiment.

Embodiments of present invention have been explained with reference to examples. However, the invention is not limited to these examples as described above.

More specifically, for example, any other size, shape, disposed pattern of top protruding portions, load of bonding, materials of the bonding strap, lead, electrode of the semiconductor device can be modified and implemented appropriately by those skilled in the art, and all of these variations are also encompassed within the scope of the invention as long as they include the features of the invention.

Furthermore, the source terminal 47s and the drain terminal 47d included in the semiconductor device may not be placed in a same plane, and can be located on different plane having different heights in a direction vertical to a major plane of the semiconductor chip. Namely, each of semiconductor devices having the source terminal and the drain terminal are also encompassed within the scope of the invention.

Alternatively, the semiconductor chip used in the present invention of is not limited to a MOSFET. Every semiconductor chip including an IGBT, a thyristor, diode, and the like could be used. In other word, each of semiconductor devices where the bonding strap is connected with the semiconductor chip are encompassed within the scope of the invention.

The invention claimed is:

1. A semiconductor device comprising:
   a semiconductor chip;
   a lead; and
   a bonding strap electrically connecting the semiconductor chip to the lead,
   a first recess being formed on an upper surface of the bonding strap in one of a first region where the bonding strap and the semiconductor chip are connected and a second region where the bonding strap and the lead is connected,
   a first pair of opposite side surfaces of the first recess extending in opposite directions at inclines from the upper surface of the bonding strap to a bottom of the recess, and
   a second pair of opposite side surfaces of the first recess sandwiching the first pair of opposite side surfaces and being substantially vertical to the upper surface of the bonding strap.

2. The semiconductor device according to claim 1, comprising a second recess formed in another of the first region where the bonding strap and the semiconductor chip are connected and the second region where the bonding strap and the lead is connected,
   a first pair of opposite side surfaces of the second recess being inclined with respect to the upper surface of the bonding strap, and
   a second pair of opposite side surfaces of the second recess being substantially vertical to the upper surface of the bonding strap.

3. The semiconductor device according to claim 1, comprising a third recess formed on the upper surface of the bonding strap in the one of the first and the second regions,
   a first pair of opposite side surfaces of the third recess being inclined with respect to the upper surface of the bonding strap, and
   a second pair of opposite side surfaces of the third recess being substantially vertical to the upper surface of the bonding strap.

4. The semiconductor device according to claim 2, wherein a size of opening of the first recess and a size of opening of the second recess are different.

5. The semiconductor device according to claim 4, wherein a material of the lead differs from a material of the bonding strap.

6. The semiconductor device according to claim 4, wherein the semiconductor chip has an electrode which is connected to the bonding strap, and a material of the electrode differs from a material of the bonding strap.

7. The semiconductor device according to claim 2, wherein an interface at which the bonding strap and the semiconductor device are bonded and an interface at which the bonding strap and the lead are bonded are substantially in a same plane.

8. The semiconductor device according to claim 2, wherein the semiconductor chip is a MOS transistor having a source electrode, a drain electrode and a gate electrode, and the bonding strap is connected to at least one of the source electrode and the drain electrode.

9. The semiconductor device according to claim 1, wherein the second pair of opposite side surfaces are in parallel with a direction along which the semiconductor chip and the lead are aligned.

10. The semiconductor device according to claim 1, wherein the second pair of opposite side surfaces are perpendicular to a direction along which the semiconductor chip and the lead are aligned.

* * * * *